(12) United States Patent
Nakamura et al.

(10) Patent No.: US 6,835,530 B2
(45) Date of Patent: Dec. 28, 2004

(54) BASE MATERIAL FOR LITHOGRAPHY

(75) Inventors: Etsuko Nakamura, Kawasaki (JP); Jun Koshiyama, Kawasaki (JP); Takeshi Tanaka, Kawasaki (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 0 days.

(21) Appl. No.: 10/648,762

(22) Filed: Aug. 26, 2003

(65) Prior Publication Data
US 2004/0121260 A1 Jun. 24, 2004

(30) Foreign Application Priority Data
Aug. 27, 2002 (JP) ........................ 2002-247187

(51) Int. Cl.$^7$ ........................ G03C 1/825; G03C 1/835; G03C 1/74; G03F 7/20; G03F 7/30
(52) U.S. Cl. ................ 430/270.1; 430/271.1; 430/325; 430/326; 430/330; 430/311; 430/907; 430/910
(58) Field of Search ................ 430/270.1, 271.1, 430/325, 326, 330, 311, 907, 910

(56) References Cited

U.S. PATENT DOCUMENTS

| | | | | |
|---|---|---|---|---|
| 5,234,990 A | * | 8/1993 | Flaim et al. | 524/609 |
| 5,756,255 A | * | 5/1998 | Sato et al. | 430/270.1 |
| 5,851,730 A | * | 12/1998 | Thackeray et al. | 430/271.1 |
| 5,851,738 A | | 12/1998 | Thackeray et al. | |
| 5,886,102 A | * | 3/1999 | Sinta et al. | 525/154 |
| 5,919,599 A | * | 7/1999 | Meador et al. | 430/271.1 |
| 6,165,697 A | | 12/2000 | Thackeray et al. | |
| 6,465,148 B1 | * | 10/2002 | Kang et al. | 430/270.1 |
| 6,653,049 B2 | * | 11/2003 | Pavelchek et al. | 430/272.1 |

FOREIGN PATENT DOCUMENTS

| | | |
|---|---|---|
| EP | 87113957.2 | 8/1992 |
| EP | 84302692.3 | 11/1992 |
| EP | 87301002.9 | 12/1993 |
| JP | 04-328816 | 4/1994 |

* cited by examiner

Primary Examiner—Cynthia H. Kelly
Assistant Examiner—Sin J. Lee
(74) Attorney, Agent, or Firm—Dechert, LLP; John W. Ryan

(57) ABSTRACT

There is provided a base material for lithography that is capable of achieving superior film formation characteristics, while maintaining good light absorption characteristics. The base material for lithography comprises (a) a cross linking agent formed from a specific nitrogen containing compound, (b) a copolymer comprising two types of (meth)acrylate ester units as represented by the general formulas (1) and (2) shown below, and (c) an organic solvent:

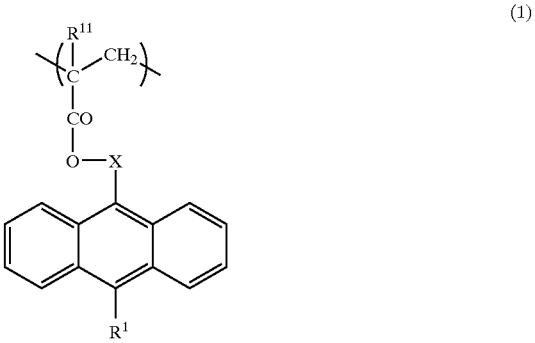

(1)

wherein, $R^1$ represents a hydroxyl group or a carboxyl group or the like, and X represents an alkyl chain of 1 to 4 carbon atoms; and

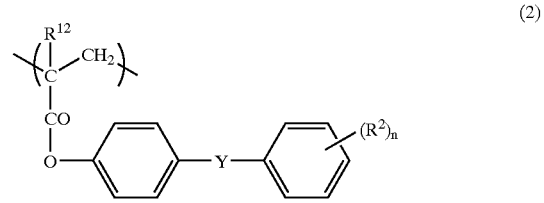

(2)

wherein, $R^2$ represents a hydroxyl group or a carboxyl group or the like, Y represents $-SO_2-$, $-CO-$ or $-SO-$; and n represents a number from 1 to 4.

9 Claims, No Drawings

BASE MATERIAL FOR LITHOGRAPHY

BACKGROUND OF THE INVENTION

1. Field of the Invention

The present invention relates to a base material for lithography, and a method of producing a resist pattern that utilizes such a base material.

2. Description of the Related Art

In recent years, as the degree of integration of electronic devices has increased, the wavelength of exposure light used in the lithography processes during the production of semiconductor elements has continued to shorten. When this type of short wavelength exposure light is used to expose a photoresist layer formed on top of a substrate, the light reflected off the substrate increases, meaning that in some cases, the desired resist pattern cannot be formed. Accordingly, a so-called anti-reflective film (a base material layer for lithography) is formed between the substrate and the photoresist layer, and this anti-reflective film absorbs the reflected light, reducing and suppressing the effects of the reflected light.

Examples of conventional lithography base materials used for forming anti-reflective films include those disclosed in Japanese Unexamined Patent Application, First Publication No. Hei 6-118631.

The lithography base materials disclosed in Japanese Unexamined Patent Application, First Publication No. Hei 6-118631 comprise an acrylic resin with an anthracene ester unit of the structure shown in the chemical formula below (a resin component), and a cross linking agent such as glycoluril, dissolved in an organic solvent.

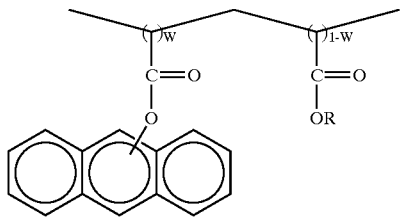

wherein, R represents a single hydrogen atom or a single alkyl group, and w represents the molar fraction of the anthracene ester unit within the polymer, which is typically within a range from 0.1 to 1.0.

In a lithography process using this type of lithography base material, the lithography base material is applied to the top surface of a substrate, and is then subjected to heat treatment, causing the resin component to undergo a cross linking reaction that forms the lithography base material layer and prevents any mixing with the subsequently formed photoresist layer. The photoresist layer is then formed on top of this lithography base material, and selectively exposed. During exposure, light that passes through the photoresist layer is absorbed by the lithography base material layer, meaning that any effects arising from the type of reflected light described above can be suppressed. Subsequently, the photoresist layer is developed, yielding a resist pattern.

However, the base materials for lithography disclosed in Japanese Unexamined Patent Application, First Publication No. Hei 6-118631 were unable to provide good film formation characteristics, while maintaining favorable light absorption characteristics (namely, a high absorption coefficient and a high refractive index). When the film formation characteristics of the lithography base material deteriorate, mixing with the photoresist layer develops, meaning the desired resist pattern cannot be obtained. In contrast, if the film formation characteristics were optimized, the targeted high level of light absorption is not achievable.

SUMMARY OF THE INVENTION

The present invention takes the above factors into consideration, with an object of providing a base material for lithography that provides superior film formation characteristics, while maintaining good light absorption characteristics.

The present invention incorporates the aspects [1] to [9] described below.

[1] A base material for lithography comprising a component (a), a component (b), and a component (c) described below:

(a) a cross linking agent;
(b) a copolymer comprising a (meth)acrylate ester unit represented by a general formula (1) shown below,

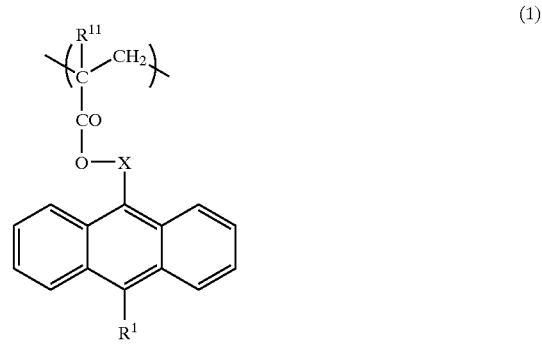

(1)

wherein, $R^1$ represents a hydrogen atom, a halogen atom, a hydroxyl group, a carboxyl group, or a hydrocarbon group of 1 to 5 carbon atoms that is substituted with at least one of a halogen atom, a hydroxyl group and a carboxyl group; X represents an alkyl chain of 1 to 4 carbon atoms; and $R^{11}$ represents a hydrogen atom or a methyl group, and a (meth)acrylate ester unit represented by a general formula (2) shown below,

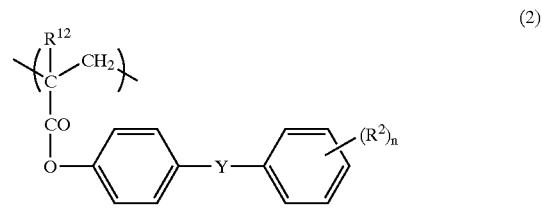

(2)

wherein, $R^2$ represents a hydroxyl group, a carboxyl group, or a hydrocarbon group of 1 to 5 carbon atoms that is substituted with at least one of a hydroxyl group and a carboxyl group; Y represents $-SO_2-$, $-CO-$ or $-SO-$; n represents a number from 1 to 4; and $R^{12}$ represents a hydrogen atom or a methyl group; and (c) an organic solvent.

[2] A base material for lithography according to aspect [1] above, wherein the component (b) is a copolymer that also comprises a (meth)acrylate ester unit represented by a general formula (3) shown below,

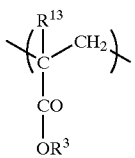 (3)

wherein, $R^3$ represents a hydrocarbon group of 1 to 5 carbon atoms; and $R^{13}$ represents a hydrogen atom or a methyl group.

[3] A base material for lithography according to either one of aspect [1] and aspect [2] above, wherein the component (a) is a nitrogen containing compound with an amino group and/or an imino group, and within all the amino groups and/or imino groups of the nitrogen containing compound, at least 2 hydrogen atoms are substituted with hydroxyalkyl groups and/or alkoxyalkyl groups.

[4] A base material for lithography according to aspect [3] above, wherein the component (a) is a condensation reaction product of the hydroxyalkyl group and/or alkoxyalkyl group with a monohydroxymonocarboxylic acid.

[5] A base material for lithography according to aspect [4] above, wherein in the monohydroxymonocarboxylic acid, the hydroxyl group and the carboxyl group are either bonded to the same carbon atom, or bonded to two adjacent carbon atoms.

[6] A base material for lithography according to aspect [5] above, wherein the monohydroxymonocarboxylic acid is at least one compound selected from a group consisting of mandelic acid, lactic acid, and salicylic acid.

[7] A base material for lithography according to any one of aspect [1] through aspect [6] above, further comprising a light absorbing component (d).

[8] A base material for lithography according to aspect [7] above, wherein the component (d) is at least one compound selected from a group consisting of anthracene based compounds, sulfone based compounds, sulfoxide based compounds and benzophenone based compounds containing at least 1 substituent group selected from a group consisting of hydroxyl group, hydroxyalkyl groups, alkoxyalkyl groups, and carboxyl groups.

[9] A method of producing a resist pattern comprising the steps of providing a lithography base material layer on top of a substrate by applying a base material for lithography according to any one of aspect [1] through aspect [8] above, and conducting heating to effect a cross linking reaction, providing a photoresist layer on top of the lithography base material layer, conducting light exposure, and developing the photoresist layer to form a resist pattern.

The base material for lithography according to the present invention provides superior film formation characteristics, while maintaining good light absorption characteristics.

DETAILED DESCRIPTION OF THE PREFERRED EMBODIMENTS (Base Material for Lithography)

As follows is a more detailed description of a base material for lithography according to the present invention, with reference to a series of examples.

(a) Cross Linking Agent

The component (a) is a cross linking agent. As described below, there are no particular restrictions on the component (a), provided it is capable of causing cross linking of the component (b), although nitrogen containing compounds with an amino group and/or an imino group, wherein within all the amino groups and/or imino groups within the nitrogen containing compound, at least 2 hydrogen atoms are substituted with hydroxyalkyl groups and/or alkoxyalkyl groups, are preferred.

The number of these substituent groups within the nitrogen containing compound is preferably at least 2, and effectively no more than 6.

Suitable examples include melamine based compounds, urea based compounds, guanamine base compounds, acetoguanamine based compounds, benzoguanamine based compounds, glycoluril based compounds, succinylamide based compounds, or ethylene urea based compounds, in which at least 2 hydrogen atoms of the amino groups and/or imino groups are substituted with methylol groups or alkoxymethyl groups.

These nitrogen containing compounds can be produced by methylolation of the aforementioned melamine based compounds, urea based compounds, guanamine based compounds, acetoguanamine based compounds, benzoguanamine based compounds, glycoluril based compounds, succinylamide based compounds, or ethylene urea based compounds by reaction with formalin in boiling water, or by subsequent alkoxylation of these methylolated compounds by reaction with a lower alcohol such as methanol, ethanol, n-propanol, isopropanol, n-butanol or isobutanol.

Of these nitrogen containing compounds, benzoguanamine based compounds, guanamine based compounds, melamine based compounds, and urea based compounds with amino groups and/or imino groups, in which at least 2 of the hydrogen atoms within all the amino groups and/or imino groups are substituted with methylol groups and/or alkoxymethyl groups are preferred. Of these, melamine based compounds are particularly preferred. Furthermore, compounds containing an average of at least 3 but less than 6 methylol groups or alkoxymethyl groups per single triazine ring are even more desirable.

Specific examples of this type of nitrogen containing compound include benzoguanamine based compounds such as methoxymethylated benzoguanamine, ethoxymethylated benzoguanamine, isopropoxymethylated benzoguanamine, isobutoxymethylated benzoguanamine, and methoxymethylated ethoxymethylated benzoguanamine; melamine based compounds such as methoxymethylated melamine, ethoxymethylated melamine, isopropoxymethylated melamine, isobutoxymethylated melamine, and methoxymethylated isobutoxymethylated melamine; and glycoluril based compounds such as methoxymethylated glycoluril, ethoxymethylated glycoluril, and isobutoxymethylated glycoluril.

In addition, from the viewpoint of improving the shape of the lower sections of the resist pattern (and preventing footing), condensation reaction products of the hydroxyalkyl group and/or alkoxyalkyl group of the component (a) with a monohydroxymonocarboxylic acid are preferred.

In terms of preventing footing, monohydroxymonocarboxylic acids in which the hydroxyl group and the carboxyl group are either bonded to the same carbon atom, or bonded to two adjacent carbon atoms are preferred.

Specific examples of such monohydroxymonocarboxylic acids include glycolic acid, lactic acid, 2-hydroxybutyric acid, 2-hydroxy-2-methylpropanoic acid, salicylic acid, 2,6-dihydroxybenzoic acid, 2,5-dihydroxybenzoic acid, 2,3,4-trihydroxybenzoic acid, 2-hydroxy-p-toluic acid, 2,4-dihydroxy-6-methylbenzoic acid, 4-allyl-2-hydroxy-6-methylbenzoic acid, hydroxyphthalic acid, hydroxyisophthalic acid, hydroxyterephthalic acid, 2,5-dihydroxyterephthalic acid, mandelic acid, 3-hydroxy-2-phenylpropionic acid, and 3-hydroxy-3-phenylpropionic acid. Of these, mandelic acid, lactic acid and salicylic acid are particularly preferred.

Furthermore, in those cases in which a condensation reaction product with a monohydroxymonocarboxylic acid is used, products produced by a condensation reaction using from 0.01 to 6 mols, and preferably from 0.1 to 5 mols, of the monohydroxymonocarboxylic acid per 1 mol of the non-condensed component (a) provide the best footing prevention effect, and are consequently preferred. The condensation reaction can be conducted using conventional methods.

The component (a) may be a single compound, or a mixture of 2 or more compounds.

The component (a) preferably accounts for 2 to 70% by weight, and even more preferably from 5 to 50% by weight of the total solid fraction of the lithography base material (the combined total of the component (a), the component (b), the component (d) which is added as required, and any other additives).

If the quantity of the component (a) is less than the lower limit of the above range, adequate cross linking cannot be achieved, whereas if the quantity exceeds the upper limit, the film formation characteristics can deteriorate to an undesirable level.

(b) Copolymer (Resin Component)

The component (b) is a copolymer (a resin component) comprising, as essential constituents, a (meth)acrylate ester unit represented by the general formula (1) shown above (hereafter, also referred to as a first unit), and a (meth) acrylate ester unit represented by the general formula (2) shown above (hereafter, also referred to as a second unit). The name (meth)acrylate includes either one, or both of methacrylates and acrylates.

First Unit

The first unit is represented by the general formula (1) shown above.

In the general formula (1), the alkylene chain of the group X is either a straight chain or a branched chain of 1 to 4 carbon atoms.

Furthermore in the first unit, the bonded anthracene unit is very important, and the effect of the unit is not diminished if the anthracene contains a substituent other than hydrogen atoms, as shown by the group $R^1$ in the formula. In addition, because X is a comparatively short alkylene chain, any unit selected within the above requirements offers the same effects.

Second Unit

The second unit is represented by the general formula (2) shown above.

In the general formula (2), Y represents $—SO_2—$, $—CO—$ or $—SO—$, and from the viewpoint of producing a high level of absorption for KrF excimer laser light, $—SO_2—$ is preferred.

By including the second unit within the component (b), the margin relating to the quantity of the component (a) that can be added increases, enabling a higher refractive index to be obtained. In other words, superior film formation characteristics can be achieved, while maintaining good light absorption characteristics.

Furthermore, a component (b) that is a copolymer that also comprises a (meth)acrylate ester unit represented by the general formula (3) above (hereafter, also referred to as a third unit), enables a higher etching rate to be achieved, and is consequently preferred.

In the general formula (3), $R^3$ represents a straight chain or branched chain hydrocarbon group of 1 to 5 carbon atoms.

The proportion of the aforementioned first unit within the resin (the component (b)) is typically within a range from 90 to 10% by weight, and preferably from 70 to 30% by weight. If this proportion exceeds 90% by weight, there is a danger of a reduction in the solubility of the resin in organic solvents, whereas if the proportion is less than 10% by weight, there is a danger of a deterioration in the reflected light absorbing properties of the resin.

Furthermore, the proportion of the second unit within the resin (the component (b)) is typically within a range from 90 to 10% by weight, and preferably from 70 to 20% by weight. If this proportion exceeds 90% by weight, there is a danger of a deterioration in the reflected light absorbing properties of the resin, whereas if the proportion is less than 10% by weight, there is a danger of a reduction in the cross linking reactivity of the resin, leading to a worsening of the film formation characteristics.

The aforementioned third unit accounts for the remaining portion of the resin after the first and second units.

The materials used to form the component (b), namely, the monomers used to form the first unit, the second unit and the third unit, can be synthesized using conventional methods.

The component (b) can then be formed by copolymerizing these monomer materials using conventional methods.

The number average molecular weight of the component (b) is within a range from 1000 to 500,000.

Moreover, the component (b) may be either a single copolymer, or a mixture of two or more different copolymers.

In addition, the component (b) preferably accounts for 30 to 98% by weight, and even more preferably from 50 to 95% by weight of the total solid fraction of the lithography base material (usually the combined total of the component (a), the component (b), the component (d) which is added as required, and any other additives). If the quantity of the component (b) is less than the lower limit of the above range, the film formation characteristics may deteriorate, whereas if the quantity exceeds the upper limit, there is a danger of a reduction in the cross linking efficiency.

(c) Organic Solvent

There are no particular restrictions on the component (c), which may be any solvent typically used in base materials for lithography.

Specific examples of suitable solvents include ketones such as acetone, methyl ethyl ketone, cyclopentanone, cyclohexanone, methyl isoamyl ketone, 2-heptanone and 1,1,1-trimethylacetone; polyhydric alcohols and derivatives thereof such as ethylene glycol, ethylene glycol monoacetate, diethylene glycol, diethylene glycol monoacetate, propylene glycol, propylene glycol monoacetate, or the monomethyl ether, monoethyl ether, monopropyl ether, monobutyl ether or monophenyl ether of any of these polyhydric alcohols; cyclic ethers such as dioxane; and esters such as ethyl lactate, methyl acetate, ethyl acetate, butyl acetate, methylpyruvate, ethyl pyruvate, methyl 3-methoxypropionate, and ethyl 3-ethoxypropionate. These organic solvents can be used singularly, or as a mixed solvent of 2 or more solvents.

Of these solvents, propylene glycol monomethyl ether acetate (PGMEA), propylene glycol monomethyl ether (PGME), 2-heptanone, and ethyl lactate are preferred.

Using this component (c), the solid fraction concentration of the lithography base material (usually the combined total of the component (a), the component (b), the component (d) which is added as required, and any other additives) is adjusted to a value within a range from 0.5 to 50% by weight, and preferably from 1 to 20% by weight. If the concentration is less than the lower limit of this range, the required film thickness cannot be achieved, whereas if the concentration exceeds the upper limit, there is a danger of a deterioration in the film formation characteristics.

(d) Light Absorbing Component

By adding an additional component (d) to the lithography base material, the light absorbing characteristics can be further improved, which is desirable.

There are no particular restrictions on the component (d), provided the material has powerful light absorbing properties relative to the exposure light used on the photoresist layer, and is capable of preventing standing waves generated by reflection off the substrate surface, and irregularly reflected light generated as a result of irregularities on the substrate surface. Materials that provide a high level of absorption for KrF excimer laser light are preferred.

Examples of suitable materials for the component (d) include salicylate based compounds, benzophenone based compounds, benzotriazole based compounds, cyanoacrylate based compounds, azo based compounds, polyene based compounds, anthraquinone based compounds, sulfone based compounds (and preferably bisphenylsulfone based compounds), sulfoxide based compounds (and preferably bisphenylsulfoxide based compounds), and anthracene based compounds.

Of these, components (d) comprising at least one compound selected from a group consisting of anthracene based compounds, bisphenylsulfone based compounds, bisphenylsulfoxide based compounds and benzophenone based compounds containing at least 1 substituent group selected from a group consisting of hydroxyl group, hydroxyalkyl groups, alkoxyalkyl groups, and carboxyl groups are preferred as they offer a high level of absorption for KrF excimer laser light.

The component (d) may be either a single compound, or a combination of 2 or more different compounds.

Of the compounds listed above, anthracene based compounds or bisphenylsulfone based compounds are particularly preferred. These compounds may be used either singularly, or in combinations of 2 or more compounds.

Specific examples of the aforementioned benzophenone compounds include 2,4-dihydroxybenzophenone, 2,3,4-trihydroxybenzophenone, 2,2',4,4'-tetrahydroxybenzophenone, 2,2',5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2',4'-dihydroxybenzophenone, and 4-dimethylamino-3',4'-dihydroxybenzophenone.

Amongst the different possible bisphenylsulfone based compounds and bisphenylsulfoxide based compounds, bis(hydroxyphenyl)sulfones, bis(hydroxyphenyl)sulfoxides, bis(polyhydroxyphenyl)sulfones, and bis(polyhydroxy)sulfoxides are preferred. Specific examples of these compounds include bis(4-hydroxyphenyl)sulfone, bis(3,5-dimethyl-4-hydroxyphenyl)sulfone, bis(4-hydroxyphenyl)sulfoxide, bis(3,5-dimethyl-4-hydroxyphenyl)sulfoxide, bis(1,3-dihydroxyphenyl)sulfone, bis(5-chloro-2,3-dihydroxyphenyl)sulfone, bis(2,4-dihydroxyphenyl)sulfone, bis(2,4-dihydroxy-6-methylphenyl)sulfone, bis(5-chloro-2,4-dihydroxyphenyl)sulfone, bis(2,5-dihydroxyphenyl)sulfone, bis(3,4-dihydroxyphenyl)sulfone, bis(3,5-dihydroxyphenyl)sulfone, bis(2,3,4-trihydroxyphenyl)sulfone, bis(2,3,4-trihydroxy-6-methylphenyl)sulfone, bis(5-chloro-2,3,4-trihydroxyphenyl)sulfone, bis(2,4,6-trihydroxyphenyl)sulfone, bis(5-chloro-2,4,6-trihydroxyphenyl)sulfone, bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl) sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide, and bis(5-chloro-2,4,6-trihydroxyphenyl)sulfoxide.

Examples of the anthracene based compounds include the compounds represented by General Chemical Formula 8 shown below.

(General Chemical Formula 8)

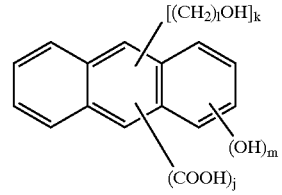

wherein, l represents an integer of 1 to 10, m represents an integer of 0 to 8, j represents an integer of 0 to 6, and k represents an integer of 0 to 6, although k and m must not both be 0.

Specific examples of compounds represented by the above General Chemical Formula 8 include 1-hydroxyanthracene, 9-hydroxyanthracene, 1,2-dihydroxyanthracene, 1,5-dihydroxyanthracene, 9,10-dihydroxyanthracene, 1,2,3-trihydroxyanthracene, 1-hydroxymethylanthracene, 9-hydroxymethylanthracene, 9-hydroxyethylanthracene, 9-hydroxyhexylanthracene, 9-hydroxyoctylanthracene, and 9,10-dihydroxymethylanthracene, 9-anthracenecarboxylic acid, 9,10-anthracenedicarboxylic acid, glycidylated anthracenecarboxylic acid. Further example of anthracene based compounds include glycidylated anthracenylmethyl alcohol, or condensation products of anthracenylmethyl alcohol with a polyvalent carboxylic acid (such as oxalic acid, malonic acid, methylmalonic acid, ethylmalonic acid, dimethylmalonic acid, succinic acid, methylsuccinic acid, 2,2-dimethylsuccinic acid, glutaric acid, adipic acid or pimelic acid).

Of the above compounds, from the viewpoints of satisfying conditions such as good reactivity and resistance to intermixing, as well as providing good light absorbing characteristics, anthracene based compounds are preferred, and 9-anthracenemethanol, 9,10-dianthracenemethanol, 9-anthracenecarboxylic acid and 9,10-anthracenedicarboxylic acid are particularly desirable.

The component (d) preferably accounts for 0.1 to 50% by weight, and even more preferably from 10 to 30% by weight of the total solid fraction of the lithography base material (usually the combined total of the component (a), the component (b), the component (d), and any other additives that are added as required). If the quantity of the component (d) is less than the lower limit of the above range, the effects are minimal, whereas if the quantity exceeds the upper limit, there is a danger of a deterioration in the film formation characteristics.

(e) Acidic Compound

An acidic compound (e) may also be added to a lithography base material of the present invention. Adding a component (e) improves the footing prevention properties of the base material.

From the viewpoint of preventing footing, the component (e) is preferably an inorganic acid or organic acid with a sulfur containing acid residue, an ester of such a compound, or a compound that generates acid on irradiation with activated light (that is, an acid generator).

Examples of inorganic acids with a sulfur containing acid residue include sulfuric acid, sulfurous acid, and thiosulfuric acid, and of these, sulfuric acid is particularly preferred. Examples of organic acids with a sulfur containing acid residue include organic sulfonic acids. Furthermore, examples of suitable esters include organic sulfates and organic sulfites. Of the above compounds, organic sulfonic acids such as the compounds represented by the General Chemical Formula 9 shown below are preferred.
(General Chemical Formula 9)

$$R^4\text{-}Z$$

wherein, $R^4$ represents a hydrocarbon group which may, or may not, have substituent groups, and Z represents a sulfonic acid group.

The group $R^4$ is preferably a hydrocarbon group of 1 to 20 carbon atoms, and this hydrocarbon group may be either saturated or unsaturated, and may be either a straight chain, branched chain, or a cyclic structure.

Suitable substituents include halogen atoms such as fluorine atoms, sulfonic acid groups, carboxyl groups, hydroxyl groups, amino groups or cyano groups, and the $R^4$ group may contain either one, or a plurality of such substituents.

If the $R^4$ group is an aromatic hydrocarbon group, then specific examples include phenyl groups, naphthyl groups and anthracenyl groups, although phenyl groups are preferred. In addition, the aromatic ring of these types of aromatic hydrocarbon groups may be bonded to one, or a plurality of alkyl groups of 1 to 20 carbon atoms. In addition, the aromatic ring may also be substituted with one, or a plurality of substituent groups, including halogen atoms such as fluorine atoms, sulfonic acid groups, carboxyl groups, hydroxyl groups, amino groups or cyano groups.

From the viewpoint of improving the shape of the lower sections of the photoresist pattern, the organic sulfonic acid is preferably nonafluorobutanesulfonic acid, methanesulfonic acid, trifluoromethanesulfonic acid, dodecylbenzenesulfonic acid, p-toluenesulfonic acid, or a mixture thereof.

Examples of suitable acid generators that can be used as the component (e) include the compounds listed below.

(A) bissulfonyldiazomethanes such as bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane, and bis(4-tert-butylphenylsulfonyl)diazomethane;

(B) nitrobenzyl derivatives such as 2-nitrobenzyl p-toluenesulfonate, 2,6-dinitrobenzyl p-toluenesulfonate, and 2,4-dinitrobenzyl p-trifluoromethylbenzenesulfonate;

(C) esters of polyhydroxy compounds and aliphatic or aromatic sulfonic acids, including methanesulfonate esters of pyrogallol (pyrogallol trimesylate), benzenesulfonate esters of pyrogallol, p-toluenesulfonate esters of pyrogallol, p-methoxybenzenesulfonate esters of pyrogallol, mesitylenesulfonate esters of pyrogallol, benzylsulfonate esters of pyrogallol, methanesulfonate esters of alkyl gallates, benzenesulfonate esters of alkyl gallates, p-toluenesulfonate esters of alkyl gallates, p-methoxybenzenesulfoante esters of alkyl gallates, mesitylenesulfonate esters of alkyl gallates, and benzylsulfonate esters of alkyl gallates;

(D) onium salts such as diphenyliodonium tetrafluoroborate, diphenyliodonium hexafluorophosphate, diphenyliodonium hexafluoroantimonate, diphenyliodonium trifluoromethanesulfonate, (4-methoxyphenyl)phenyliodonium hexafluoroantimonate, (4-methoxyphenyl)phenyliodonium trifluoromethanesulfonate, bis(p-tert-butylphenyl)iodonium tetrafluoroborate, bis(p-tert-butylphenyl)iodonium hexafluorophosphate, bis(p-tert-butylphenyl)iodonium hexafluoroantimonate, bis(p-tert-butylphenyl)iodonium trifluoromethanesulfonate, triphenylsulfonium hexafluorophosphate, triphenylsulfonium hexafluoroantimonate, and triphenylsulfonium trifluoromethanesulfonate;

(E) sulfonylcarbonylalkanes such as 2-methyl-2-(p-toluenesulfonyl)propiophenone, 2-(cyclohexylcarbonyl)-2-(p-toluenesulfonyl)propane, 2-methanesulfonyl-2-methyl-(4-methylthio)propiophenone, and 2,4-dimethyl-2-(p-toluenesulfonyl)pentan-3-one;

(F) sulfonylcarbonyldiazomethanes such as 1-p-toluenesulfonyl-1-cyclohexylcarbonyldiazomethane, 1-diazo-1-methylsulfonyl-4-phenyl-2-butanone, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl 2-diazo-2-methanesulfonylacetate, cyclohexyl 2-diazo-2-benzenesulfonylacetate, and tert-butyl 2-diazo-2-(p-toluenesulfonyl)acetate;

(G) benzoin tosylates such as benzoin tosylate and α-methylbenzoin tosylate;

(H) halogen containing triazine compounds such as 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine, and tris(2,3-dibromopropyl)isocyanurate;

(I) oxime sulfonate based compounds such as α-(methylsulfonyloxyimino)phenylacetonitrile, α-(toluenesulfonyloxyimino)phenylacetonitrile, α-(p-chlorobenzenesulfonyloxyimino)phenylacetonitrile, α-(4-nitrobenzenesulfonyloxyimino)phenylacetonitrile, α-(4-nitro-2-trifluoromethylbenzenesulfonyloxyimino)phenylacetonitrile, α-(methylsulfonyloxyimino)-1-phenylacetonitrile, α-(methylsulfonyloxyimino)-4-methoxyphenylacetonitrile, α-(methylsulfonyloxyimino)-1-(p-methylphenyl)acetonitrile, α-(methylsulfonyloxyimino)-1-(p-methoxyphenyl)acetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-

2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)phenylacetonitrile, α-(toluenesulfonyloxyimino)-4-methoxyphenylacetonitrile, α-(4-dodecylbenzenesulfonyloxyimino)-4-methoxyphenylacetonitrile, α-(trisulfonyloxyimino)-3-thienylacetonitrile, α-(ethylsulfonyloxyimino)-4-methoxyphenylacetonitrile, α-(trifluoromethylsulfonyloxyimino)-4-methoxyphenylacetonitrile, α-(propylsulfonyloxyimino)-4-methoxyphenylacetonitrile, α-(methylsulfonyloxyimino)-4-bromophenylacetonitrile, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-1-cyclohexenylacetonitrile, α-(ethylsulfonyloxyimino)ethylacetonitrile, α-(propylsulfonyloxyimino)propylacetonitrile, α-(cyclohexylsulfonyloxyimino)cyclopentylacetonitrile, α-(cyclohexylsulfonyloxyimino)cyclohexylacetonitrile, α-(cyclohexylsulfonyloxyimino)-1-cyclopentenylacetonitrile, α-(1-naphthylsulfonyloxyimino)-4-methoxybenzylcyanide, α-(2-naphthylsulfonyloxyimino)-4-methoxybenzylcyanide, α-(1-naphthylsulfonyloxyimino)benzylcyanide, α-(2-naphthylsulfonyloxyimino)benzylcyanide, α-(10-camphorsulfonyloxyimino)-4-methoxybenzylcyanide, α(10-camphorsulfonyloxyimino)benzylcyanide, α-(3-camphorsulfonyloxyimino)-4-methoxybenzylcyanide, α-(3-bromo-10-camphorsulfonyloxyimino)-4-methoxybenzylcyanide, and compounds represented by the chemical formulas shown below;

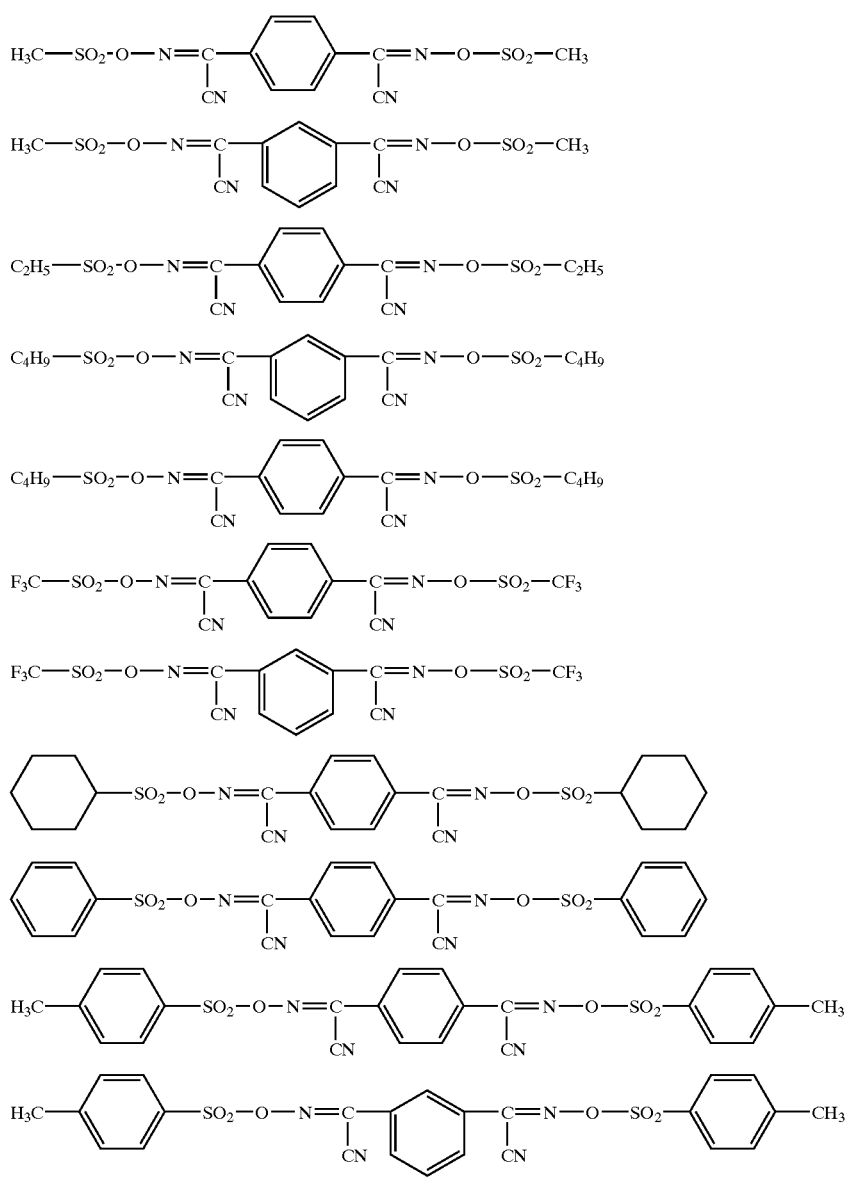

-continued

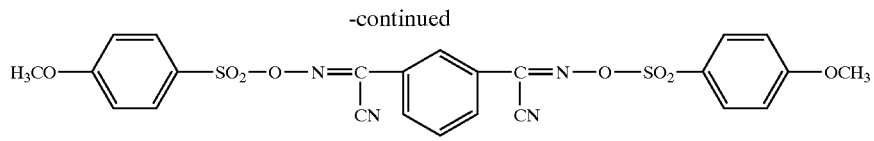

(J) imide based compounds such as N-methylsulfonyloxysuccinimide, N-isopropylsulfonyloxysuccinimide, N-chloroethylsulfonyloxysuccinimide, N-(p-methoxyphenyl)sulfonyloxysuccinimide, N-(p-vinylphenyl)sulfonyloxysuccinimide, N-naphthylsulfonyloxysuccinimide, N-phenylsulfonyloxysuccinimide, N-(2,3,6,-triphenyl)sulfonyloxysuccinimide, N-methylsulfonyloxymaleimide, N-isopropylsulfonyloxymaleimide, N-chloroethylsulfonyloxymaleimide, N-(p-methoxyphenyl)sulfonyloxymaleimide, N-(p-vinylphenyl)sulfonyloxymaleimide, N-naphthylsulfonyloxymaleimide, N-phenylsulfonyloxymaleimide, N-(2,3,6-triphenyl)sulfonyloxymaleimide, N-methylsulfonyloxyphthalimide, N-isopropylsulfonyloxyphthalimide, N-chloroethylsulfonyloxyphthalimide, N-(p-methoxyphenyl)sulfonyloxyphthalimide, N-(p-vinylphenyl)sulfonyloxyphthalimide, N-naphthylsulfonyloxyphthalimide, N-phenylsulfonyloxyphthalimide, and N-(2,3,6-triphenyl)sulfonyloxyphthalimide.

The above acid generators can be used either singularly, or in combinations of 2 or more compounds.

The component (e) preferably accounts for 0.01 to 30% by weight, and even more preferably from 0.1 to 20% by weight of the total solid fraction of the lithography base material. If the quantity of the component (e) is less than the lower limit of the above range, the effects are minimal, whereas if the quantity exceeds the upper limit, there is a danger of the lower sections of the resist pattern being eroded.

Surfactant

A surfactant can also be added to the lithography base material to further improve the ease of application.

Examples of suitable surfactants include fluorine based surfactants such as SURFLON SC-103 and SURFLON SR-100 (manufactured by Asahi Glass Co., Ltd.), EF-351 (manufactured by Tohoku Hiryo Co., Ltd.), FLUORAD Fc-431, FLUORAD Fc-135, FLUORAD Fc-98, FLUORAD Fc-430, and FLUORAD Fc-176 (manufactured by Sumitomo 3M Corporation), and MEGAFAC R-08 (manufactured by Dainippon Ink and Chemicals, Inc.).

The quantity of surfactant added is preferably less than 2000 ppm relative to the total solid fraction of the lithography base material (usually the combined total of the component (a), the component (b), the component (d) which is added as required, and any other additives).

In addition, other known additives may also be added to a base material for lithography according to the present invention, provided such addition does not impair the effects of the invention.

The lithography base material is prepared by dissolving the component (a), the component (b), and the component (d) which is added as required, the component (e) and any other additives such as surfactants, in the solvent of the component (c).

(Method of Producing a Resist Pattern)

First, the lithography base material is applied to a highly reflective substrate, and is then heated to initiate the cross linking reaction and form a base material layer.

The resist pattern can then be produced by conventional methods, by providing a photoresist layer on top of the thus formed base material layer, selectively exposing the photoresist layer, and then conducting a developing process.

Generally, in those sections where the photoresist layer has been removed by the developing process, the base material layer is then removed by dry etching or the like, and by subsequently etching the substrate, a predetermined wiring pattern can be formed on the substrate.

The temperature conditions for the cross linking reaction are typically set to 120 to 300° C., and preferably from 160 to 250° C.

There are no particular restrictions on the method used to form the base material layer from the lithography base material, the thickness of the base material layer, the method used to form the resist layer, or the exposure conditions and the like, all of which can be selected in accordance with the intended application of the final product.

However, the base material for lithography described above offers a high level of reflected light absorption when a KrF excimer laser is used for the exposure, and consequently the base material is ideally suited to applications that utilize KrF excimer laser exposure.

By adopting the configuration described above, a base material for lithography according to the present invention can achieve superior film formation characteristics while maintaining good light absorption characteristics.

Furthermore, because the base material displays comparatively good solubility in organic solvents, a homogeneous liquid lithography base material can be prepared with ease.

Furthermore, the lithography base material is not limited to applications involving the provision of a base material layer (anti-reflective film) on the surface of a flat substrate, and can also be used for applications such as smoothing out a surface on which minute grooves have been formed as a result of providing wiring on top of a substrate.

In addition, recent copper damascene processes also require the embedding of a lithography base material in the fine grooves to form a base material layer.

Even if the film thickness of the lithography base material layer is comparatively thin, adequate light absorption can still be achieved, and the absorption characteristics are particularly good for KrF excimer lasers.

In addition, because the etching rate for the formed base material layer is high, the thickness of the photoresist layer can be reduced.

EXAMPLES

As follows is a more detailed description of the present invention, based on a series of examples.

Examples 1 to 4, Comparative Examples 1 to 3

Base materials for lithography were prepared using the compositions shown in Table 1 below.

In the lithography base material compositions shown in Table 1, it is evident that compared with Examples 1 and 2, Comparative Example 1 uses a smaller quantity of the unit (1) containing the bonded anthracane, which effects the light absorbing properties of the composition. However, in Comparative Example 1, if the quantity of the unit (1) is increased beyond this level, the component does not dissolve in the solvent, whereas if the quantity of the unit (4) is reduced any further, the cross linking reaction fails to proceed (in either case, the film formation characteristics deteriorate), and consequently the composition for Comparative Example 1 shown in Table 1 was determined by balancing the solubility and cross linking reactivity, while ensuring as large a quantity of the unit (1) as possible.

In contrast, in Examples 1 and 2, because the unit (2) is used, the unit (1) can be added in a larger quantity than in Comparative Example 1, without impairing the film formation characteristics, and hence the compositions shown in Table 1 were used.

The concentration values shown in Table 1 refer to solid fraction concentration levels within the lithography base material.

Using these compositions, base material layers prepared in the manner described below were evaluated for light absorbing characteristics and film formation characteristics. Furthermore, the pattern shape of a resist pattern formed on top of each base material layer was also evaluated. The results are shown in Table 2.

Each of the base materials for lithography was applied to the surface of a silicon substrate to form a base material layer with no cross linking, and the layer was then baked for 90 seconds at 200° C. to cause the cross linking reaction, thereby forming a base material layer of thickness 50 nm.

Subsequently, a positive type photoresist TDUR-P308 (manufactured by Tokyo Ohka Kogyo Co., Ltd.) was applied to the top of the base material layer and baked for 90 seconds at 90° C., thereby forming a photoresist film of thickness 400 nm.

Exposure processing (selective exposure) was then performed with a NSR-2005EX8A device (manufactured by Nikon Corporation), postbaking was conducted for 90 seconds at 110° C. on a hotplate, and the photoresist was then developed in a 2.38% by weight aqueous solution of tetramethylammonium hydroxide (TMAH), and washed with pure water, yielding a 0.18 $\mu$m L/S (line and space) pattern.

(Light Absorbing Characteristics of the Base Material Layer Relative to Exposure Light)

The light absorbing characteristics were evaluated by determining the N value and the K value for the base material layer. These values were determined for KrF excimer laser light (wavelength 248 nm), and were measured using a spectroscopic ellipsometer.

(Film Formation Characteristics of the Base Material Layer)

A sample with a base material layer formed on top of a substrate was immersed in a resist solvent (such as PGME, PGMEA, 2-heptanone, or ethyl lactate) for 30 seconds, and the variation in film thickness (the film thinning) was measured.

In addition, following immersion in the resist solvent, the base material layer was developed (60 seconds puddle development using NMD-3 (manufactured by Tokyo Ohka Kogyo Co., Ltd.)), and thereafter, the variation in film thickness (the film thinning) was measured in the same manner as above.

Samples for which the variation in film thickness was less than ±10 Å were evaluated as OK, whereas samples with a variation of ±10 Å or greater were rated NG.

(Resist Pattern Shape)

The shapes of the resist patterns were inspected using a SEM (scanning electron microscope) and evaluated as follows.

Samples for which a rectangular L/S pattern was obtained were evaluated as OK, whereas samples that displayed broadening at the base were rated NG.

TABLE 1

|  | (a) | (b) | (c) | (d) | Concentration (wt %) |
|---|---|---|---|---|---|
| Example 1 | Mx-750 (0.30 g) | (1) + (2) (weight ratio 58:42) (0.70 g) | 2-heptanone | — | 3.0 |
| Example 2 | Modified Mx-750 (0.30 g) | (1) + (2) (weight ratio 58:42) (0.70 g) | 2-heptanone | — | 3.0 |
| Example 3 | Mx-750 (0.30 g) | (1) + (2) + (3) (weight ratio 47:36:17) (0.50 g) | PGMEA | — | 3.0 |
| Example 4 | Mx-750 (0.30 g) | (1) + (2) + (3) (weight ratio 47:36:17) (0.50 g) | PGMEA | 9-anthracenecarboxylic acid (0.20 g) | 3.0 |
| Comparative example 1 | Mx-750 (0.30 g) | (1) + (3) + (4) (weight ratio 24:28:43) (0.70 g) | PGMEA | — | 3.0 |
| Comparative example 2 | Mx-750 (0.30 g) | (3) + (5) (weight ratio 1:1) (0.70 g) | PGMEA | — | 3.0 |
| Comparative example 3 | Mx-750 (0.30 g) | (2) (0.70 g) | PGME | — | 3.0 |

Notes:
1 Mx-750 and modified Mx-750 are both products manufactured by Sanwa Chemical Co., Ltd., and the modified Mx-750 is a product in which the methylol groups within the structure have been subjected to a condensation reaction with mandelic acid.
2 The units (1) to (5) of the component (b) are as shown below.

TABLE 2

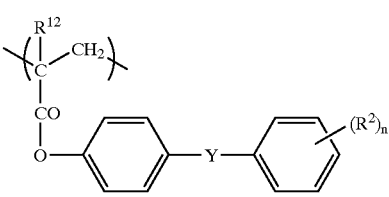

|  | Light absorbing characteristics (N value/K value) | Film formation characteristics | Pattern shape |
|---|---|---|---|
| Example 1 | 1.55/0.69 | OK | OK |
| Example 2 | 1.51/0.67 | OK | OK |
| Example 3 | 1.55/0.65 | OK | OK |
| Example 4 | 1.60/0.67 | OK | OK |
| Comparative example 1 | 1.50/0.65 | NG | NG |
| Comparative example 2 | 1.63/0.04 | OK | NG |
| Comparative example 3 | 1.82/0.24 | OK | NG |

The N values and the K values are relative to KrF excimer laser light.

From the results in Table 2 it is evident that the base material layers from Examples all display high K values and D values, and offer good light absorbing characteristics, enabling good absorption of exposure light, even if the thickness of the base material layer is comparatively thin.

Furthermore, the film formation characteristics for the base material layers of Examples were also favorable.

In addition, the patterns shapes produced were also favorable, indicating that in each case, the base material layer was able to adequately absorb reflected exposure light.

Example 4, which also included a component (d), displayed superior light absorbing characteristics.

In contrast, it is evident that in Comparative Example 1, which used units (3) and (4) in the component (b) instead of the unit (2) that corresponds with the aforementioned second unit, the film formation characteristics were unsatisfactory.

Furthermore, in Comparative Examples 2 and 3, which contained no units with bonded anthracene groups, the K value was low, and the light absorbing characteristics were poor, and as a result the pattern shape was also unsatisfactory.

What is claimed is:

1. A base material for lithography comprising a component (a), a component (b), and a component (c) described below:

(a) a cross linking agent;
   (b) a copolymer comprising a (meth)acrylate ester unit represented by a general formula

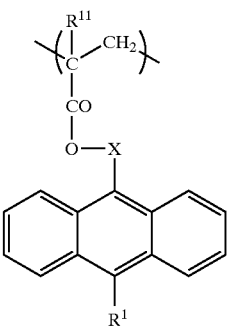

wherein, $R^1$ represents a hydrogen atom, a halogen atom, a hydroxyl group, a carboxyl group, or a hydrocarbon group of 1 to 5 carbon atoms that is substituted with at least one of a halogen atom, a hydroxyl group and a carboxyl group; X represents an alkyl chain of 1 to 4 carbon atoms; and $R^{11}$ represents a hydrogen atom or a methyl group, and a (meth)acrylate ester unit represented by a general formula (2) shown below, (2)

wherein, $R^2$ represents a hydroxyl group, a carboxyl group, or a hydrocarbon group of 1 to 5 carbon atoms that is substituted with at least one of a hydroxyl group and a carboxyl group; Y represents —$SO_2$—, —CO— or —SO—; n represents a number from 1 to 4; and $R^{12}$ represents a hydrogen atom or a methyl group; and (c) an organic solvent.

2. A base material for lithography according to claim 1, wherein said component (b) is a copolymer that also comprises a (meth)acrylate ester unit represented by a general formula (3) shown below:

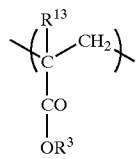
(3)

wherein, $R^3$ represents a hydrocarbon group of 1 to 5 carbon atoms; and R represents a hydrogen atom or a methyl group.

3. A base material for lithography according to claim 1, wherein said component (a) is a nitrogen containing compound with an amino group and/or an imino group, and within all said amino groups and/or imino groups of said nitrogen containing compound, at least 2 hydrogen atoms are substituted with hydroxyalkyl groups and/or alkoxyalkyl groups.

4. A base material for lithography according to claim 3, wherein said component (a) is a condensation reaction product of said hydroxyalkyl group and/or alkoxyalkyl group with a monohydroxymonocarboxylic acid.

5. A base material for lithography according to claim 4, wherein in said monohydroxymonocarboxylic acid, a hydroxyl group and a carboxyl group are either bonded to an identical carbon atom, or bonded to two adjacent carbon atoms.

6. A base material for lithography according to claim 5, wherein said monohydroxymonocarboxylic acid is at least one compound selected from the group consisting of mandelic acid, lactic acid, and salicylic acid.

7. A base material for lithography according to claim 1, further comprising a light absorbing component (d).

8. A base material for lithography according to claim 7, wherein said component (d) is at least one compound selected from the group consisting of anthracene based compounds, sulfone based compounds, sulfoxide based compounds and benzophenone based compounds containing at least 1 substituent group selected from the group consisting of hydroxyl group, hydroxyalkyl groups, alkoxyalkyl groups, and carboxyl groups.

9. A method of producing a resist pattern comprising the steps of: providing a lithography base material layer on top of a substrate by applying a base material for lithography according to any one of claim 1 through claim 8, and conducting heating to effect a cross linking reaction; providing a photoresist layer on top of said lithography base material layer; conducting light exposure; and developing said photoresist layer to form a resist pattern.

* * * * *